United States Patent [19]

Defranco et al.

[11] Patent Number: 5,349,462
[45] Date of Patent: Sep. 20, 1994

[54] SINGLE SEND-RECEIVE OPTICAL HEAD FOR TRANSMISSION AND RECEPTION OF DATA BY OPTICAL SYSTEM, AND ASSOCIATED SWITCHING CIRCUIT

[75] Inventors: Jean-Marc Defranco, Malesherbes; Florence Barnabe, Paris; Alain Rouzier, Le Blanc Mesnil, all of France

[73] Assignee: Thomson-Csf, Puteaux, France

[21] Appl. No.: 100,290

[22] Filed: Sep. 20, 1993

[30] Foreign Application Priority Data

Sep. 1, 1992 [FR] France ............... 92 10433

[51] Int. Cl.$^5$ ........................... H04B 10/00
[52] U.S. Cl. ........................ 359/152; 359/154; 372/38
[58] Field of Search .......... 359/113, 117, 128, 132, 359/143, 152, 154, 173, 180; 372/38; 307/311

[56] References Cited

U.S. PATENT DOCUMENTS

| | | | |
|---|---|---|---|
| 4,168,427 | 9/1979 | Hubbard | 359/152 |
| 4,687,957 | 8/1987 | O'Neil, II | 307/311 |
| 4,972,514 | 11/1990 | Linke | 359/182 |
| 5,020,153 | 5/1991 | Choa et al. | 359/154 |
| 5,111,451 | 5/1992 | Piasecki et al. | 370/29 |

FOREIGN PATENT DOCUMENTS

| | | | |
|---|---|---|---|
| 0330190 | 8/1989 | European Pat. Off. | |
| 3203094 | 8/1983 | Fed. Rep. of Germany | 359/152 |
| 2546012 | 11/1984 | France | 359/152 |
| 2662883 | 12/1991 | France | |
| 2254213 | 9/1992 | United Kingdom | 359/113 |

OTHER PUBLICATIONS

Electronics Letters Vol. 21, no. 11, p. 511–512 May 23 1985 Stevenage, Herts, Great Britian.
Patent Abstracts of Japan Vol. 10, no. 263 (E-435) (2319) Sep. 9, 1986.

*Primary Examiner*—Richard E. Chilcot, Jr.
*Assistant Examiner*—Kinfe-Michael Negash
*Attorney, Agent, or Firm*—Oblon, Spivak, McClelland, Maier & Neustadt

[57] ABSTRACT

An optical head incorporating a single opto-electronic component and a laser device for transmitting and receiving data on a single optical fiber. The use of a single laser device for both sending and receiving data is made possible by a switching circuit, controlled by two transistors which forward-bias the laser device for transmission and reverse-bias the laser device for reception. Such a device may find particular application to data transmission on an optical path, and particularly between 1 and 10 GHz.

8 Claims, 2 Drawing Sheets

5,349,462

SINGLE SEND-RECEIVE OPTICAL HEAD FOR TRANSMISSION AND RECEPTION OF DATA BY OPTICAL SYSTEM, AND ASSOCIATED SWITCHING CIRCUIT

BACKGROUND OF THE INVENTION

The present invention concerns a send-receive optical head used for data transmission or telecommunications by optical fiber or optic systems.

The optical head, designed to function using a single optical fiber that transmits signals in both directions (full duplex), uses only one opto-electronic component: a semiconductor laser device used in conjunction with a switching circuit which is unique to the invention.

DESCRIPTION OF THE PRIOR ART

Fiber optic cables are known to provide a very powerful and a very fast means of exchanging data, due in particular to the fact that light travels at a greater speed than electrons. The field of opto-electronics, however, is less technically advanced than that of electronics, and experience is especially limited in the area of light beam switching.

Thus, the simplest system for data transmission, shown in FIG. 1, consists of a pair of optical fibers, each equipped with a light-emitting semiconductor, E, at one end, and a light-receiving semiconductor, R, at the other, with the sending and receiving circuits working in opposite directions.

This system could also be designed using a single optical fiber as shown in FIG. 2. In this case, a demultiplexor or switch, C, is placed at each end of the optical fiber, between the optical fiber and the light-emitting and light-receiving components. The majority of switches actually used are based on the principal of reflection and their construction is more mechanical than electronic.

In either case, since the techniques of light beam switching have not yet been perfected, two different types of components are used for sending and receiving at each end of the optical fiber, giving a total of 4 semiconductor chips.

The control circuits and their semiconductor components are fairly simple, and are represented in FIGS. 3 to 5.

For transmission, the output stage of the sending amplifier, shown in FIG. 3, generally consists of a differential pair of transistors, driven by current sources $I_{max}$ and $I_{min}$, connected to a laser diode. The data D and $\overline{D}$, in the case of digital data transmission, is applied to the transistor bases and controls $I_{max}$ which flows through the forward-biased laser device.

The circuit shown in FIG. 4 is equivalent to the one shown in FIG. 3. Instead of controlling $I_{max}$ and $I_{min}$ directly through the laser device, $I_{mean}$ is controlled in the differential pair connected to the laser. To this current $I_{mean}$ is added the current excursion $\Delta \frac{i}{2}$ controlled by the data D and $\overline{D}$ applied to another differential pair.

For reception, the photo-receptor, which is reverse-biased, is followed by an amplifier for which the simplest and most efficient known design is of the current-shunt feedback type shown in FIG. 5. The photo-receptor is of the light-sensitive diode type.

SUMMARY OF THE INVENTION

The invention introduces a great simplification in implementing optical data transmission links, in both digital and analog systems, by proposing a send-receive optical head that uses only a single opto-electronic component, namely a laser diode having good transmission (10 GHz) and reception (3 GHz) characteristics.

The use of a laser diode as a photo-receptor is made possible by the switching circuit, which is the object of the invention, and which allows the driving circuit for transmission, or the detection circuit, to be electrically isolated, even though the two circuits share a common component (the laser which is forward-biased for transmission and reverse-biased for reception).

More precisely, the invention concerns a send-receive optical head, consisting of an opto-electronic circuit aligned with an optical system, the optical head being characterized by the fact that it contains a single opto-electronic component: a semiconductor laser used in conjunction with a switching circuit which provides the laser with reverse-bias for data reception.

BRIEF DESCRIPTION OF THE DRAWINGS

The invention will be better understood, and other characteristics will be brought out on reading the description given below with reference to the appended drawings of which.

DESCRIPTION OF THE PREFERRED EMBODIMENT

Figure 1:
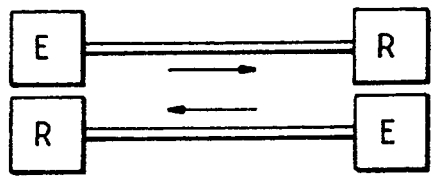
FIGS. 1 and 2 are general diagrams representing an optical link using 2 and 1 optical fibers respectively.
Figure 2:
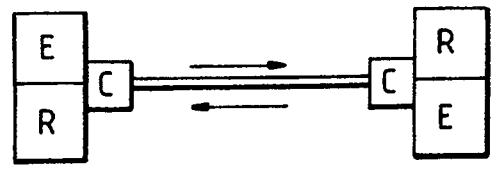
Figure 3:
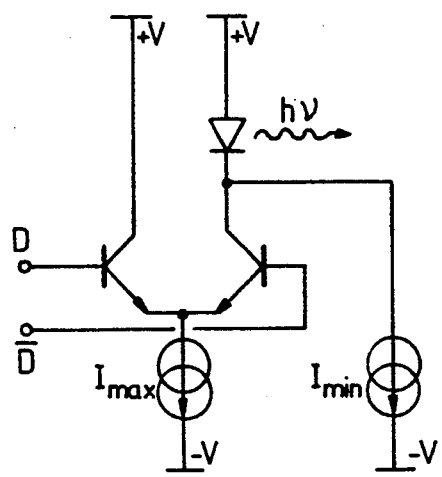
FIGS. 3 and 4 are electric circuit diagrams showing the bias of a laser for data transmission, according to the prior art.
Figure 4:
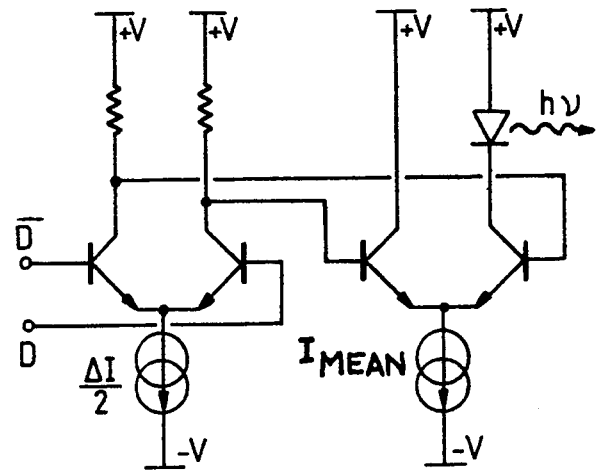
Figure 5:
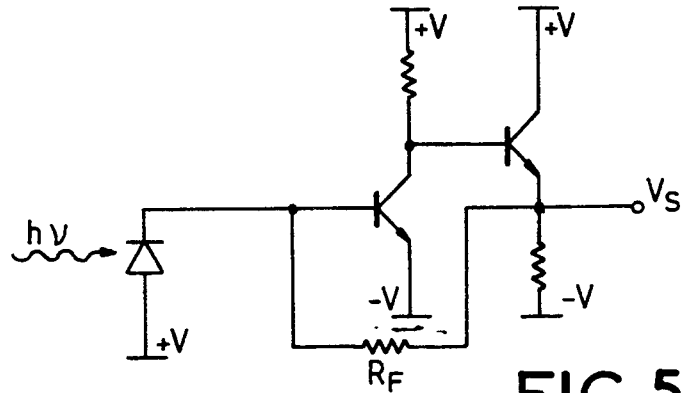
FIG. 5 is the electric circuit diagram showing the bias of a photodiode for data reception, according to the prior art.
Figure 6:
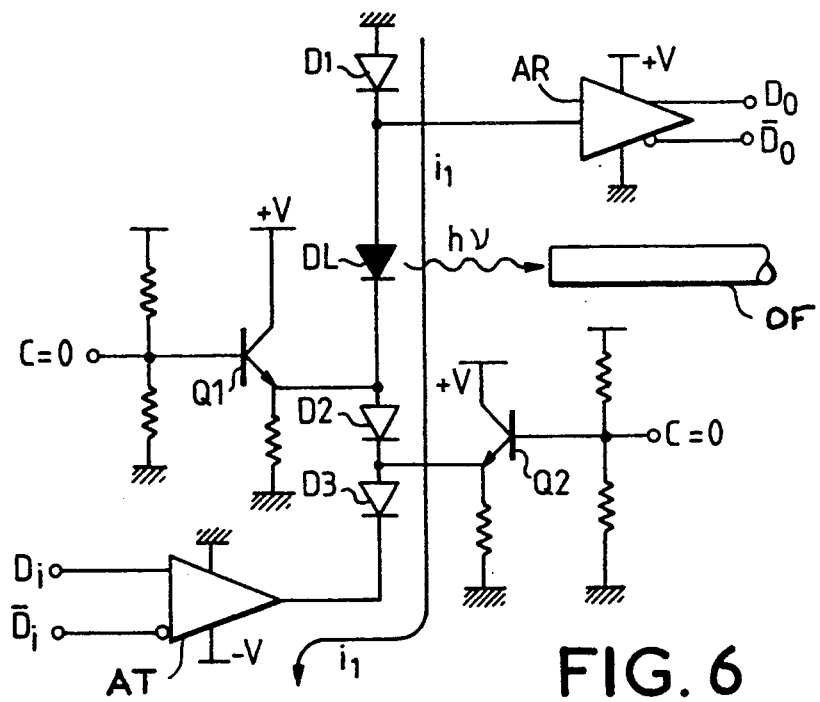
FIGS. 6 and 7 represent the switching circuit diagram, according to the invention, in each of the two states.
Figure 7:
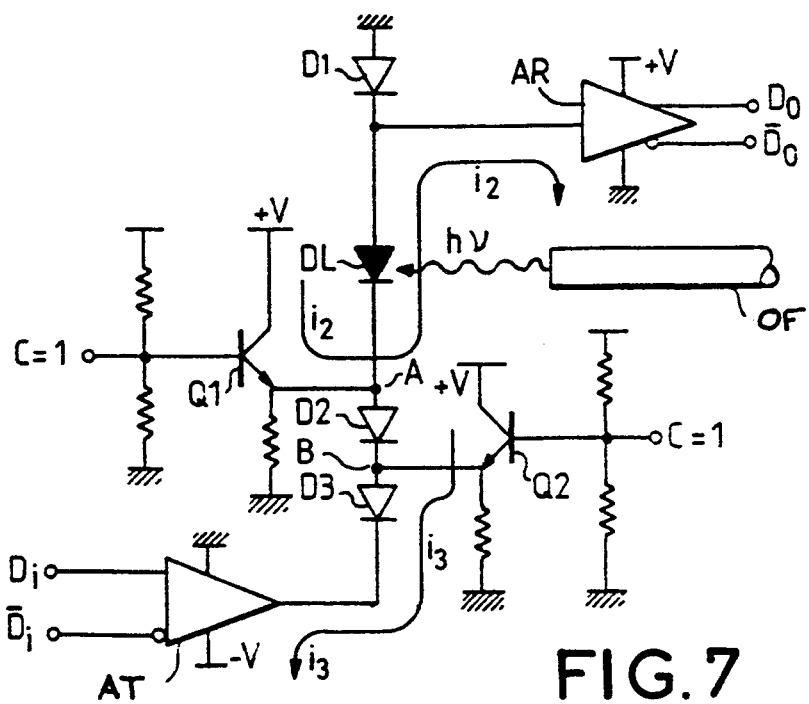

Since the optical head according to the invention has only one send-receive opto-electronic component, it requires only one optical fiber for data transmission, and does not need the demultiplexor used in the prior art shown in FIG. 2. FIGS. 6 and 7 represent the electric circuit diagram for the switching circuit according to the invention, shown twice in order to make it easier to understand how the circuit works in transmission (FIG. 6) and in reception (FIG. 7). It will be clear to all electronics specialists, however, that the example chosen to illustrate the invention can be equally well adapted to other types of semiconductor components (NPN and PNP transistors, FETs, etc.), or to other types of bias, and that the optical fiber can be replaced by an atmospheric optical system with or without lenses, while still remaining within the domain of the invention.

The circuit consists essentially of the following components:

- 4 diodes connected in series between a first and a second voltage source, for example, between ground and a negative supply $-V$, with forward bias. The second of these 4 diodes is the laser diode DL.
- A transmission amplifier AT, whose output is connected to the cathode of the last diode D3.
- A reception amplifier AR, whose input is connected to the cathode of the first diode D1.
- Two controls C, supplied by a third voltage source, consisting of two transistors Q1 and Q2, with their emitters connected to the anode of the second diode D2 in the case of Q1, and to the cathode of the same diode D2 in the case of Q2. The transistor bases are supplied across voltage dividers.

Using fast diodes of the Schottky type for diodes D1, D2 and D3 provides two advantages: their time constant is short> and their switching time can be less than 250 ns. In addition, the voltage drop across these diodes is small, so that the overall difference in voltage drop between this circuit and one without the switching circuit, but without Schottky diodes, is negligible.

Transistors Q1 and Q2, for the two control inputs C, are preferably bipolar NPN transistors. The small base-collector capacitance of these devices and their high transition frequency for a few milliamps make it possible to obtain a bandwidth of approximately 1 GHz.

The circuit diagrams in FIGS. 6 and 7 show that the inputs and outputs of the transmission (AT) and reception (AR) amplifiers respectively are suited for digital data transmission. Their analog data equivalents, with a single input and a single output could equally well be used to illustrate the invention.

FIG. 6 shows how the optical head and the switching circuit work in send mode. Controls C are, in this example, at logical zero, i.e. transistors Q1 and Q2 are OFF and play no active part in the switching circuit. If depletion mode field effect transistors were used for Q1 and Q2, the controls C would be, on the contrary, at logical "1". Diodes D1, D2 and D3, and the laser diode, DL are forward-biased. The input of the receiving amplifier, AR, is set to approximately $-0.7$ V, which corresponds to the voltage drop in D1, and the amplifier AR is itself OFF. The laser diode DL, in send mode, has a forward bias of between $-0.7$ V (at the cathode of D1) and approximately $-3.1$ V at the output of the transmitting amplifier AT, and converts the data sent by the transmitting amplifier and carried by current $i_1$, into optical power which is in turn transmitted to optical fiber OF.

It should be noted that, in send mode, the transmission amplifier AT is ON while the reception amplifier AR is OFF, due to the bias of $-0.7$ V applied to its input by D1 which, by its mere presence, acts as a switch for the reception amplifier.

The way the optical head and switching circuit operate in receive mode is illustrated in FIG. 7 which, apart from showing the different currents that flow in this mode, is identical to FIG. 6.

An optical signal, carried by the optical fiber OF, is detected by the laser diode DL, provided that the laser diode is in receive mode, i.e. is reverse-biased. To obtain reverse-bias, controls C are set to logical "1" and transistors Q1 and Q2 are ON. A reverse current $i_2$ flows through the laser diode DL, from the positive supply of transistor Q1 to the ground of the receiving amplifier AR, which then transmits the data received from the optical fiber to its outputs.

Current $i_2$ is channelled along its route by diodes D1 and D2 which are OFF. If A and B are points on the anode and cathode of diode D2 respectively, to which the emitters of transistors Q1 and Q2 are connected, D2 is OFF because, using voltage dividers connected to the bases of transistors Q1 and Q2, a greater voltage is applied to B than to A, i.e. D2 is reverse-biased.

The choice of resistance values in the voltage dividers is governed by the value of the voltage in A required to reduce the equivalent capacitance of the reverse-biased laser device.

During data reception, the transmission amplifier AT is ON. It is supplied by current $i_3$ which comes from the positive supply of transistor Q2, flows through D3 and in turn supplies the negative input of amplifier AT. This current $i_3$ is isolated from current $i_2$ by diode D2, which is OFF. Thus, in receive mode, both amplifiers are ON, but any data that may pass through amplifier AT is blocked by D2. Nevertheless, since AT is constantly ON, the optical head moves more rapidly from the send state to the receive state and vice versa.

The switching circuit has been presented using diodes D1 to D3 to isolate different parts of the circuit according to its use in send or receive mode. Several variations, all of which are part of the domain of the invention, are possible. For example:

The three diodes D1 to D3 can be replaced by bipolar transistors connected as diodes. This enables a homogeneous technical approach to be adopted for integrating amplifiers Q1 and Q2 and transistors D1 to D3.

Diode D1 can be replaced by a field effect transistor. Clearly, this requires a gate voltage $V_G$ which is not needed with a diode, but it allows better matching between its equivalent resistance and the input resistance of the current-shunt feedback reception amplifier.

Control transistors Q1 and Q2 can be replaced by logic AND or OR gates.

The optical head according to the invention can, of course, be used equally well to send or receive electronic analog data, by suitably adapting the offset, gain etc. of the input and output amplifiers.

In this case, two inputs $D_i$ and $\overline{D}_i$, and two outputs $D_O$ and $\overline{D}_O$ are no longer required; single channels with respect to ground are sufficient.

The optical head according to the invention can find application, in a general manner, in the domain of optical data transmission, either for telecommunications applications, or in instrumentation.

What is claimed is

1. A switching circuit for use in conjunction with a semiconductor laser device operating in both send and receive modes, comprising:
   a first diode connected to a first voltage source;
   a laser connected in series to the first diode;
   a second diode connected in series to the laser;
   a third diode connected in series to the second diode and connected to a second voltage source;
   a transmission amplifier having an output connected to a cathode of the third diode;
   a reception amplifier having an input connected to a cathode of the first diode;
   a first control device connected to an anode of the second diode; and
   a second control device connected to a cathode of the second diode, wherein the first and second control devices are connected to a third voltage source.

2. A switching circuit according to claim 1, wherein in send mode, the control devices are in an OFF state and the laser is forward-biased, and a first current flows through the first, second and third diodes from the first to the second voltage source, to the transmission amplifier.

3. A switching circuit according to claim 1, wherein in receive mode, the control devices are in an ON state, so that a voltage applied to the cathode of the second diode is greater than that applied to the anode of the second diode which is in an OFF state, and the laser is reversed-biased, a second current flowing through the first control device, the laser and the reception amplifier, this current being isolated by the first and second diodes which are OFF.

4. A switching circuit according to claim 3, wherein in receive mode, the transmission amplifier is ON, but is isolated from the laser by the second diode which is OFF.

5. A switching circuit according to claim 1, wherein the first and second control devices are bipolar transistors.

6. A switching circuit according to claim 1, wherein the first and second control devices are logic gates.

7. A switching circuit according to claim 1, wherein the first, second and third diodes comprise bipolar transistors connected as diodes.

8. A switching circuit according to claim 1, wherein the first, second and third diodes comprise field effect transistors connected as diodes.

* * * * *